US009960224B2

(12) United States Patent
Goh et al.

(10) Patent No.: US 9,960,224 B2
(45) Date of Patent: May 1, 2018

(54) THREE CAPACITOR STACK AND ASSOCIATED METHODS

(71) Applicant: Intel Corporation, Santa Clara, CA (US)

(72) Inventors: Eng Huat Goh, Penang (MY); Jiun Hann Sir, Gelugor (MY); Han Kung Chua, Bayan Lepas (MY); Min Suet Lim, Simpang Ampat (MY); Hoay Tien Teoh, Paya Terubong (MY)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 15/282,504

(22) Filed: Sep. 30, 2016

(65) Prior Publication Data
US 2018/0097056 A1  Apr. 5, 2018

(51) Int. Cl.
H01L 49/02 (2006.01)
(52) U.S. Cl.
CPC .................................. H01L 28/75 (2013.01)
(58) Field of Classification Search
CPC ....... H01L 28/75; H01L 45/00; H01L 45/146; H01L 45/1253
See application file for complete search history.

(56) References Cited

U.S. PATENT DOCUMENTS

| 2007/0188267 | A1  | 8/2007 | Togashi |
| 2014/0175364 | A1* | 6/2014 | Wang .................. H01L 45/1253 257/4 |
| 2015/0115893 | A1  | 4/2015 | Lee et al. |

FOREIGN PATENT DOCUMENTS

| JP | 10154632 A   | 6/1998 |
| JP | 2002026677 A | 1/2002 |
| JP | 2014096541 A | 5/2014 |

OTHER PUBLICATIONS

"International Application Serial No. PCT/US2017/048824, International Search Report dated Dec. 5, 2017", 3 pgs.
"International Application Serial No. PCT/US2017/048824, Written Opinion dated Dec. 5, 2017", 8 pgs.

* cited by examiner

*Primary Examiner* — Kyoung Lee
(74) *Attorney, Agent, or Firm* — Schwegman Lundberg & Woessner, P.A.

(57) ABSTRACT

A three capacitor stack and associated methods are shown. An exemplary capacitor device may include a first capacitor stack that includes a first plurality of layers of reference electrodes interleaved with first capacitor electrodes, a second capacitor stack on the first capacitor stack that includes a second plurality of layers of reference electrodes interleaved with second capacitor electrodes, and a third capacitor stack on the second capacitor stack that includes a reference electrode and a third capacitor electrode. A respective layer of dielectric material is formed between the reference electrodes and the first capacitor electrodes, the second capacitor electrodes, and the third capacitor electrode.

25 Claims, 9 Drawing Sheets

THREE CAPACITOR STACK AND ASSOCIATED METHODS

BACKGROUND

In power delivery network design, various resonant frequency capacitors may be applied at various locations to provide a full system-om-chip (SoC) load requirement. Miniaturization of an overall solution sizes, particularly for small computing device designs having a large processing core, a system-in-device approach is becoming more prevalent. To support the miniaturization of solution sizes, a reduction in size and/or quantity of devices/components may be desirable.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Although the present disclosure uses elements of semiconductor chip devices, and their method of manufacture as an example, the disclosure is not so limited. Examples of the present disclosure may be used in any technology where formation of a solder ball in a solder resist layer is controlled.

Figure 1:
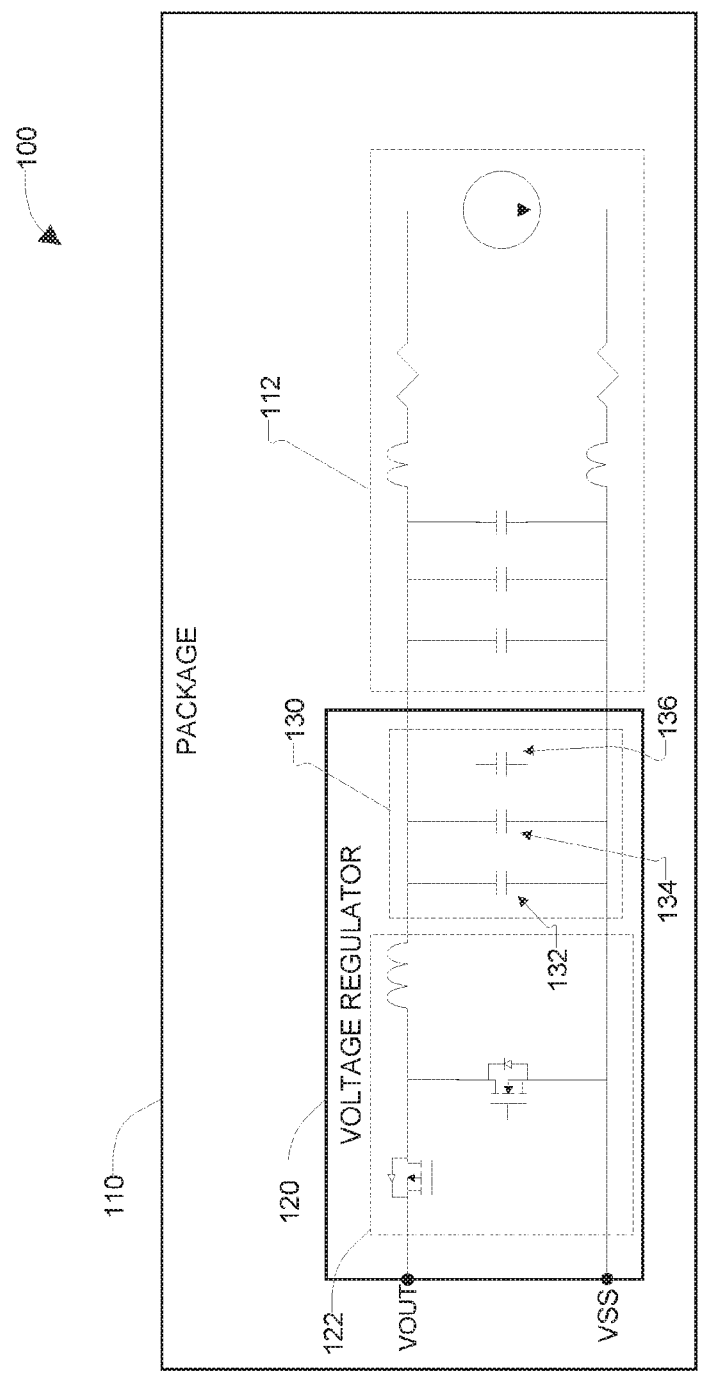
FIG. 1 shows an example of a power delivery network having a three-in-one capacitor according to some embodiments of the disclosure.

FIG. 1 shows an example of a power delivery network 100 having a three-in-one capacitor according to some embodiments of the disclosure. The PDN may include a system in package (SiP) 110 that includes a voltage regulator 120. The SiP 110 may include circuitry 112 to provide power to a voltage regulator 120. The circuitry 112 may include resistors, inductors, capacitors, etc., to provide the power, meet load requirements, and filter out frequencies.

The voltage regulator 120 may include circuitry 122 and a capacitor device 130 to provide a regulated voltage VOUT and a reference voltage VSS. The circuitry 122 may include transistors, diodes, inductors, etc., to provide the VOUT and VSS voltages with proper loading.

The capacitor device 130 may include a first capacitor 132, a second capacitor 134, and a third capacitor 136 to filter out frequencies in the in the VOUT and VSS voltages. IN some examples, multiple resonant frequencies may need to be filtered out. In some examples, the first capacitor 132, the second capacitor 134, and the third capacitor 136 may each be targeted to a different frequency. For example, each of the first capacitor 132, the second capacitor 134, and the third capacitor 136 may have different capacitances, with the individual capacitances targeted to filtering a specific frequency. In some examples, rather than including the first capacitor 132, the second capacitor 134, and the third capacitor 136 in two or more separate devices, the first capacitor 132, the second capacitor 134, and the third capacitor 136 may be included in a single capacitor device 130. In some examples, the capacitor device 130 may included in a chipset. In some examples, the capacitor device 130 may be attached to a board as part of the chipset.

Figure 2A:
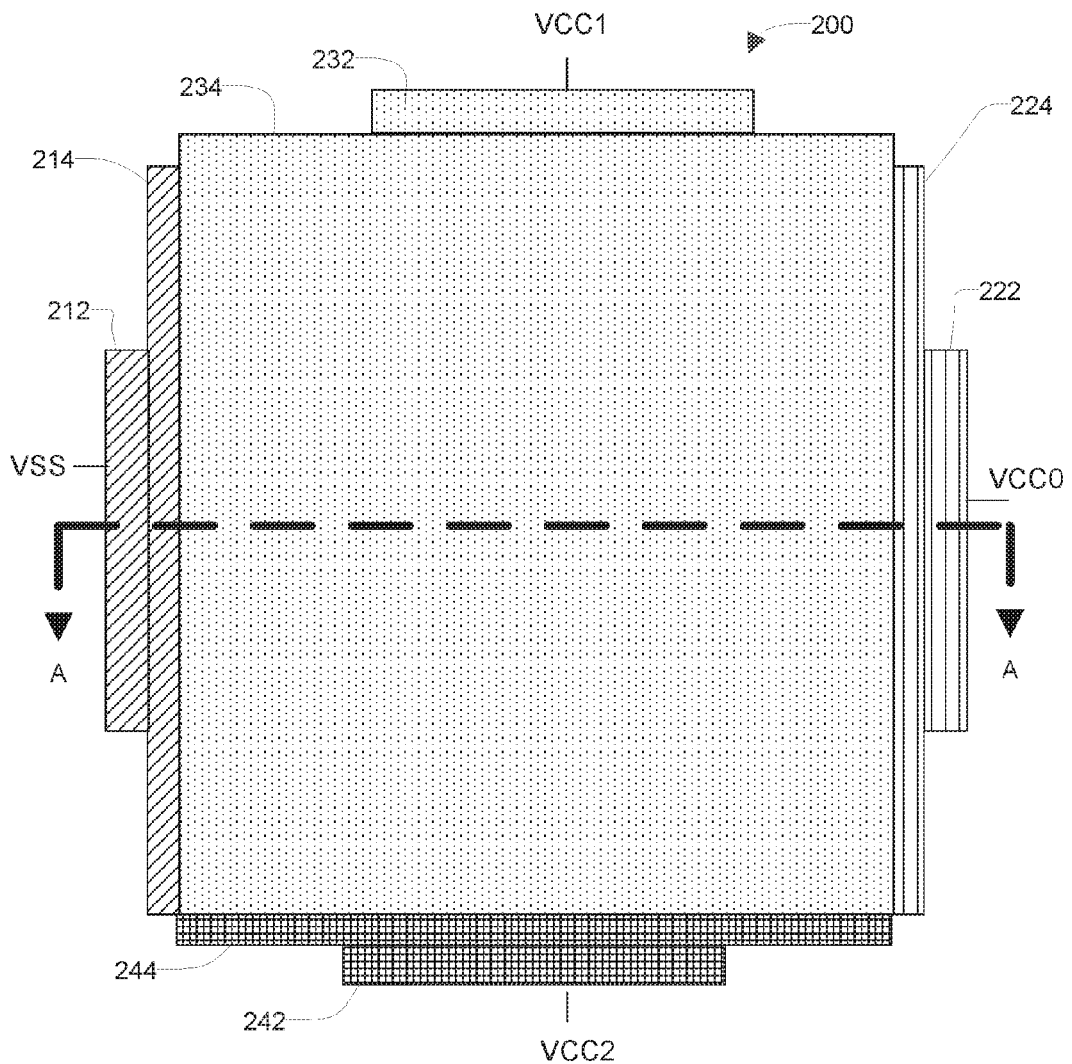
FIGS. 2A and 2B depict schematic views of a device that includes three capacitors according to an embodiment of the disclosure.
Figure 2B:
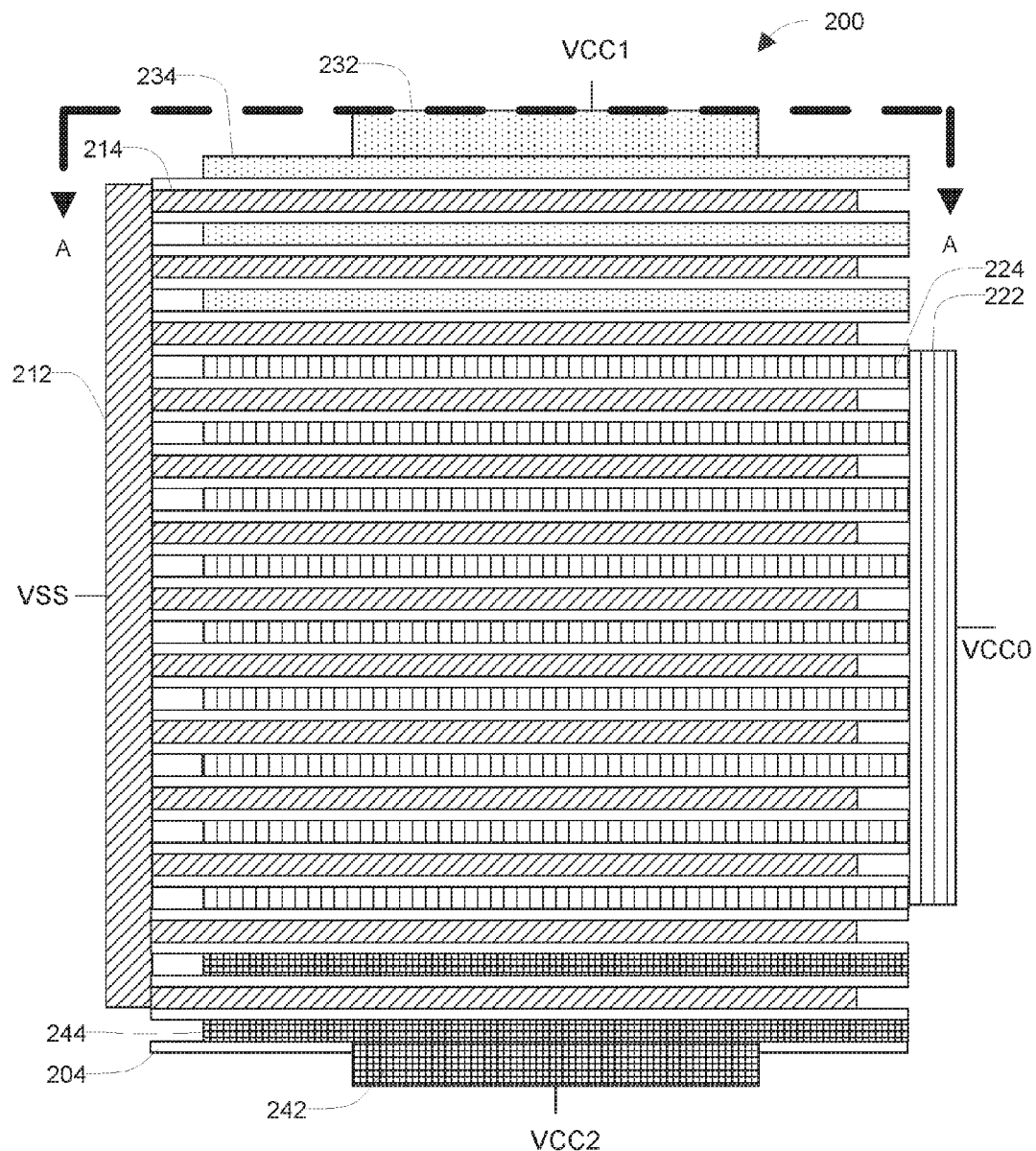

FIGS. 2A and 2B depict schematic views of a capacitor device 200 that includes three capacitors according to an embodiment of the disclosure. FIG. 2A depicts a top-down schematic view of the capacitor device 200. FIG. 2B depicts a cross-sectional view of the capacitor device 200 along cross-section line A. The capacitor device 200 of FIGS. 2A and 2B, respectively, may include some of the same materials/layers/components. Those materials/layers/components that are common among each of the views of the capacitor device 200 of FIGS. 2A and 2B use common reference numbers. In the interests of brevity and clarity, description of the formation of these common layers/materials/components will not be repeated for each figure.

Turning now to FIGS. 2A and 2B, the capacitor device 200 may include a stack of alternating reference electrode layers 214 and capacitor electrode layers 224, 234, and 244 separated by a dielectric layer dielectric layer 204 to form a first capacitor 220, a second capacitor 230, and a third capacitor 240. In some examples, the capacitor device 200 is a multi-layer ceramic chip capacitor (MLCC) device. The common conductors 210 may include the reference electrodes 214 connected to a reference contact 214 on a first side of the capacitor device 200. The reference contact 212 may be coupled to a reference voltage VSS. The first capacitor 220 may include first capacitor electrodes 224 connected a second contact 222 on a second side of the capacitor device 200. The second contact 222 may be coupled to a first voltage VCC0. The second capacitor 230 may include second capacitor electrodes 234 connected to a third contact 232 on a third side of the capacitor device 200. The third contact 232 may be coupled to a second voltage VCC1. The third capacitor 240 may include third capacitor electrodes 244 connected to a fourth contact 242. The fourth contact 242 may be coupled to a third voltage VCC2 on a fourth side of the capacitor device 200.

The following discussion of layers of electrodes references focuses on the capacitor electrodes 224, 234, and 244 associated with each of the first capacitor 220, the second capacitor 220, and the third capacitor 240, respectively. It is understood that each of the first capacitor 220, the second capacitor 220, and the third capacitor 240 also include alternating or interleaved layers of the reference electrodes 214 to form the first capacitor 220, the second capacitor 220, and the third capacitor 240. A count of layers of the capacitor electrodes 224, 234, and 244, along with a material of the capacitor electrodes 224, 234, and 244, a thickness of the dielectric layer 204 between adjacent reference/capacitor electrodes 214, 224, 234, and 244, and an active area where the adjacent reference/capacitor electrodes overlap with each other in the "A" direction, may set the capacitance of each of the first capacitor 220, the second capacitor 230, and the third capacitor 240, respectively. For example, the first capacitor 220 may have a capacitance associated with 9 electrodes 224 of a first conductive material, the second capacitor 230 may have a capacitance associated with 3 electrodes 234 of a second conductive material, and the third capacitor 240 may have a capacitance associated with 2 electrodes 244 of a third conductive material.

The reference electrodes 214 may include a fourth conductive material. In some examples, the first, second, third, and fourth conductive materials may all be the same conductive material. In other examples, the first, second, third, and fourth conductive materials may each be a different material. In other examples, the first, second, third, and fourth may be any combination of the same or different materials. In some examples, respective one of the electrodes of the reference electrodes 214 may match include a material that is the same as a material of electrodes of the associated one of the first capacitor 220, the second capacitor 230, or the third capacitor 240. For example, the individual ones of the reference electrodes 214 that are interleaved with the capacitor electrodes 224 of the first capacitor 220 may have a same material as the capacitor electrodes 224, the individual ones of the reference electrodes 214 that are interleaved with the capacitor electrodes 234 of the second capacitor 230 may have a same material as the capacitor electrodes 234, and the individual ones of the reference electrodes 214 that are interleaved with the capacitor electrodes 244 of the third capacitor 240 may have a same material as the capacitor electrodes 244.

The first, second, third, and fourth conductive materials may include a metal material, such as palladium alloys, silver alloys, nickel alloys, copper alloys, or combinations thereof. Other conductive materials may be used for the first, second, third, and fourth conductive materials, such as copper or copper alloys, aluminum or aluminum alloys, etc. The contacts 212, 222, 232, and 242 may also include metal materials. In some examples, each of the contacts 212, 222, 232, and 242 may include the same material as the material of the reference/capacitor electrode 214, 224, 234, and 244 to which it is connected. In another example, the 212, 222, 232, and 242 may each include a same material, regardless of a material the associated reference/capacitor electrodes 214, 224, 234, or 244. In some examples, the contacts 212, 222, 232, and 242 may include silver, copper, nickel, aluminum, etc. In some examples, the dielectric layer 204 may include a ceramic material. For example, the dielectric layer 204 may include a paraelectric material, such as Titanium dioxide (TiO), a ferroelectric material, such as barium titanate (BaTiO). The dielectric layer 204 may further include additives, such as aluminum silicate, magnesium silicate, aluminum oxide, Zinc, Zirconium, Niobium, Magnesium, Tantalum. Cobalt or Strontium. A dielectric thickness between a gap of a reference electrode 214 and an adjacent ones of the electrodes 224, 234, or 244 may be less than 0.5 µm.

The count of the capacitor electrodes 224, 234, and 244 associated with each of the first capacitor 220, the second capacitor 230, and the third capacitor 240, respectively, depicted in FIG. 2B are exemplary. The capacitor device 200 may include more or fewer capacitor electrodes 224, 234, and 244 (and a corresponding more or fewer count of the reference electrodes 214) associated with each of the first capacitor 220, the second capacitor 230, and the third capacitor 240, respectively, based on a desired capacitance of each of the first capacitor 220, the second capacitor 230, and the third capacitor 240. In some examples, a count of capacitor electrodes 224, 234, and 244 associated with at least one of the first capacitor 220, the second capacitor 230, and the third capacitor 240, respectively, may include 10 or more electrodes, 100 or more electrodes, etc. A total count of reference/capacitor electrodes 214, 224, 234, and 244 in the capacitor device 200 may be limited by a height restriction associated with the capacitor device 200.

As depicted in FIG. 2B, a count of the capacitor electrodes 224 associated with the first capacitor 220 may be different than a count of the capacitor electrodes 234 associated with the second capacitor 230 or a count of the capacitor electrodes 244 associated with the third capacitor 240. In some examples, the first capacitor 220, the second capacitor 230, or the third capacitor 240 may have a same count of capacitor electrodes 224, 234, and 244, respectively, as another of the first capacitor 220, the second capacitor 230, or the third capacitor 240. In some examples, each of the capacitors 220, 230, and 240 may have an order of magnitude fewer number of electrodes than a next smallest size electrode. For example, the first capacitor 220 may include 100 electrodes, the second capacitor 230 may include 10 electrodes, and the third capacitor 240 may include 1 electrode. In one example, the capacitance associated with the first capacitor 220 may be 47 µF, capacitance associated with the second capacitor 230 may be 4.7 µF, and capacitance associated with the third capacitor 240 may be 0.47 µF. In another example, the capacitance associated with the first capacitor 220 may be 22 µF, capacitance associated with the second capacitor 230 may be 2.2 µF, and capacitance associated with the third capacitor 240 may be 0.22 µF.

FIGS. 3A-3D show a cross-section schematic view of formation of a device including three capacitors in accordance with embodiments of the disclosure. The device 300), device 301, device 302, and device 303 of FIGS. 3A-3D, respectively, may include some of the same materials/layers/components. Those materials/layers/components that are common among all or a subset of the device 300, device 301, device 302, and device 303 of FIGS. 3A-3D use common reference numbers. In the interests of brevity and clarity, description of the formation of these common layers/materials/components will not be repeated for each figure.

Figure 3A:
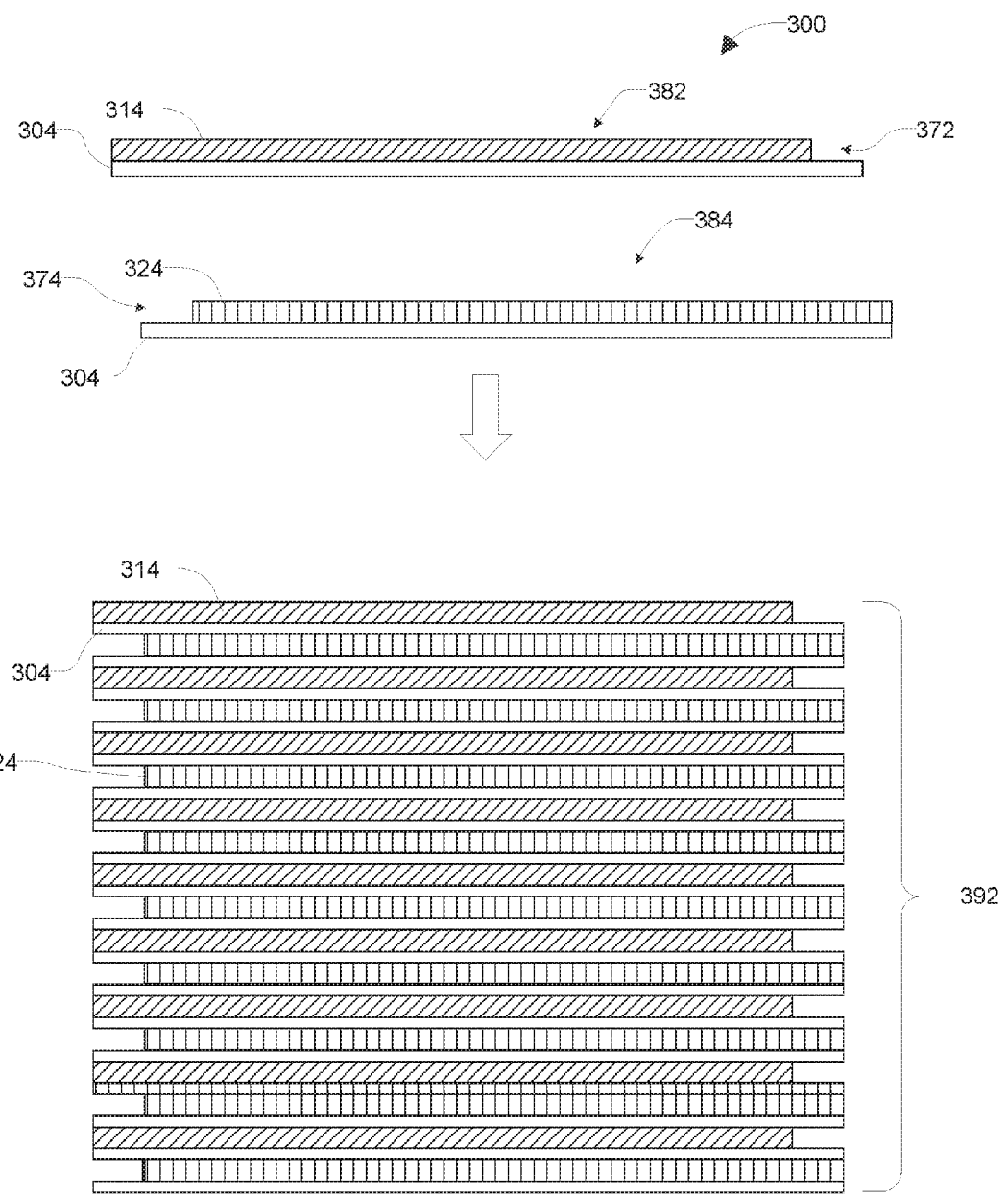
FIGS. 3A-3D show a cross-section schematic view of formation of a devices including three capacitors in accordance with embodiments of the disclosure.

Turning now to FIG. 3A, the device 300 may include a reference electrode stackable unit 382 and a first capacitor electrode stackable unit 384 that are stacked in alternating fashion to form a first capacitor stack 392. While the first capacitor stack 392 shows 9 pairs of the reference electrode stackable unit 382 and the first capacitor electrode stackable unit 384, the first capacitor stack 392 may include more or fewer pairs of the reference electrode stackable unit 382 and the first capacitor electrode stackable unit 384. The reference electrode stackable unit 382 may include a reference electrode 314 and a dielectric layer 304. The reference electrode 314 may be offset from the one edge of the dielectric layer 304 for form a first offset 372. The first capacitor electrode stackable unit 384 may include a second contact 322 and a dielectric layer 304. The first capacitor electrode 324 may be offset from the one edge of the dielectric layer 304 for form a second offset 374. A length of the first offset 372 may be equal in length to the second offset 374. The reference electrode 314 and the first capacitor electrode 324 may include conductive materials. In some examples, the reference electrode 314 and the first capacitor electrode 324 may include the same material. In some examples, the reference electrode 314 and the first capacitor electrode 324 may include different materials. In some examples, the reference electrode 314 and/or the first capacitor electrode 324 may include at least one of palladium or palladium alloys, silver or silver alloys, nickel or nickel alloys, copper or copper alloys, or combinations thereof. In some examples, the dielectric layer 304 may include a ceramic material. For example, the dielectric layer 304 may include a paraelectric material, such as Titanium dioxide (TiO), a ferroelectric material, such as barium titanate (BaTiO). The dielectric layer 304 may further include additives, such as aluminum silicate, magnesium silicate, aluminum oxide, Zinc, Zirconium, Niobium, Magnesium, Tantalum, Cobalt or Strontium. The dielectric may have a thickness of less than 0.5 µm.

Figure 3B:
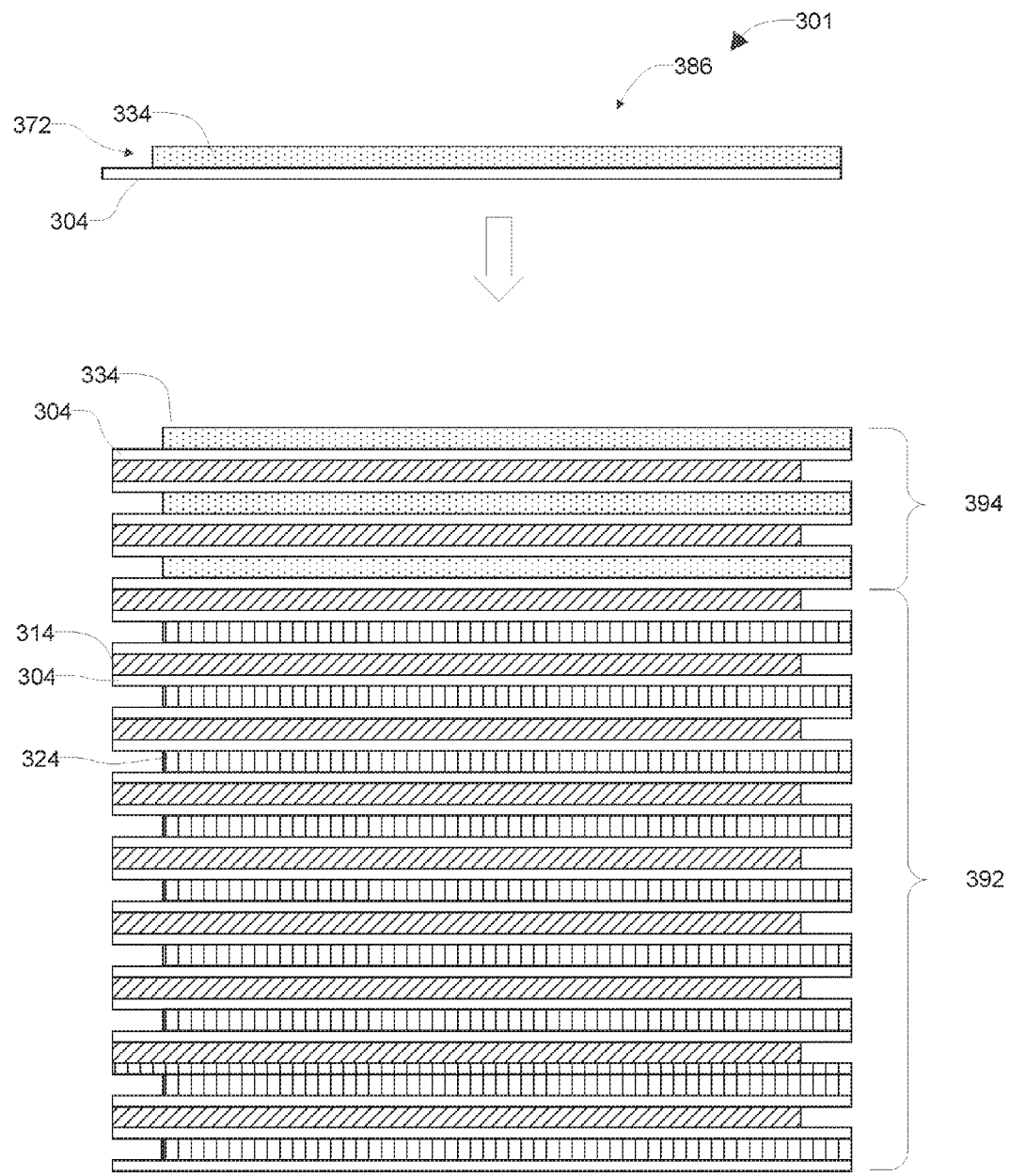

Turning now to FIG. 3B, the device 301 may include a reference electrode stackable unit 382 and a second capacitor electrode stackable unit 386 that are stacked in alternating fashion to form a second capacitor stack 394. While the second capacitor stack 394 shows 3 pairs of the reference electrode stackable unit 382 and the second capacitor electrode stackable unit 386, the second capacitor stack 394 may include more or fewer pairs of the reference electrode stackable unit 382 and the second capacitor electrode stackable unit 386. The second capacitor electrode stackable unit 386 may include a second capacitor electrode 334 and a dielectric layer 304. The second capacitor electrode 334 may be offset from the one edge of the dielectric layer 304 for form the second offset 374. The second capacitor electrode 334 may include a conductive material. In some examples, the second capacitor electrode 334 may include the same material of the reference electrode 314 or the first capacitor electrode 324. In some examples, the second capacitor electrode 334 may include different materials than the reference electrode 314 or the first capacitor electrode 324. In some examples, the second capacitor electrode 334 may include at least one of palladium or palladium alloys, silver or silver alloys, nickel or nickel alloys, copper or copper alloys, or combinations thereof.

Figure 3C:
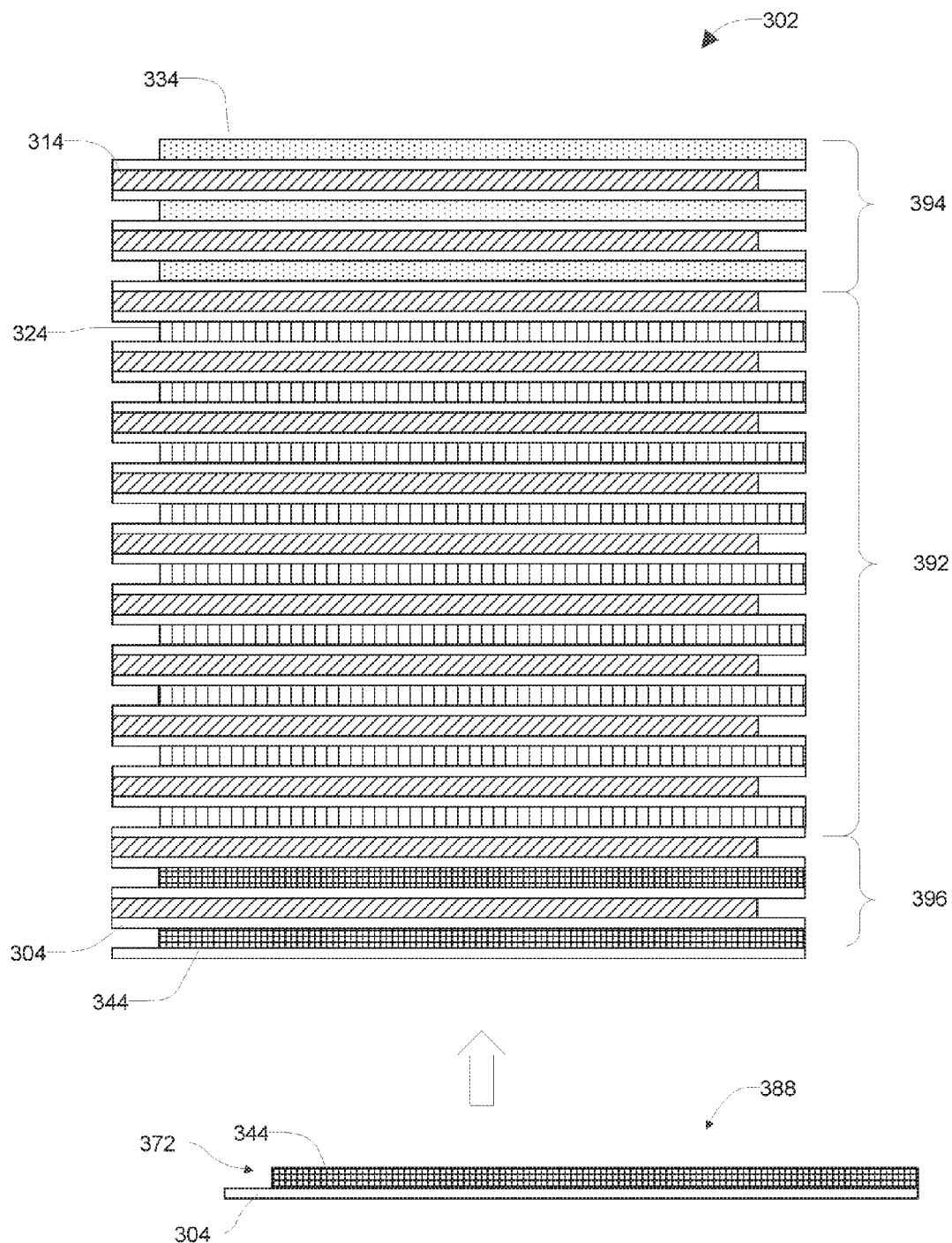

Turning now to FIG. 3C, the device 302 may include a reference electrode stackable unit 382 and a third capacitor electrode stackable unit 388 that are stacked in alternating fashion to form a third capacitor stack 396. While the third capacitor stack 396 shows 2 pairs of the reference electrode stackable unit 382 and the third capacitor electrode stackable unit 388, the third capacitor stack 396 may include more or fewer pairs of the reference electrode stackable unit 382 and the third capacitor electrode stackable unit 388. The third capacitor electrode stackable unit 388 may include a third capacitor electrode 344 and a dielectric layer 304. The third capacitor electrode 344 may be offset from the one edge of the dielectric layer 304 for form the second offset 374. The third capacitor electrode 344 may include a conductive material. In some examples, the third capacitor electrode 344 may include the same material as one or more of the reference electrode 314, the first capacitor electrode 324, or the second capacitor electrode 334. In some examples, the third capacitor electrode 344 may include different materials than one or more of the reference electrode 314, the first capacitor electrode 324, or the second capacitor electrode 334. In some examples, the third capacitor electrode 344 may include at least one of palladium or palladium alloys, silver or silver alloys, nickel or nickel alloys, copper or copper alloys, or combinations thereof.

Figure 3D:
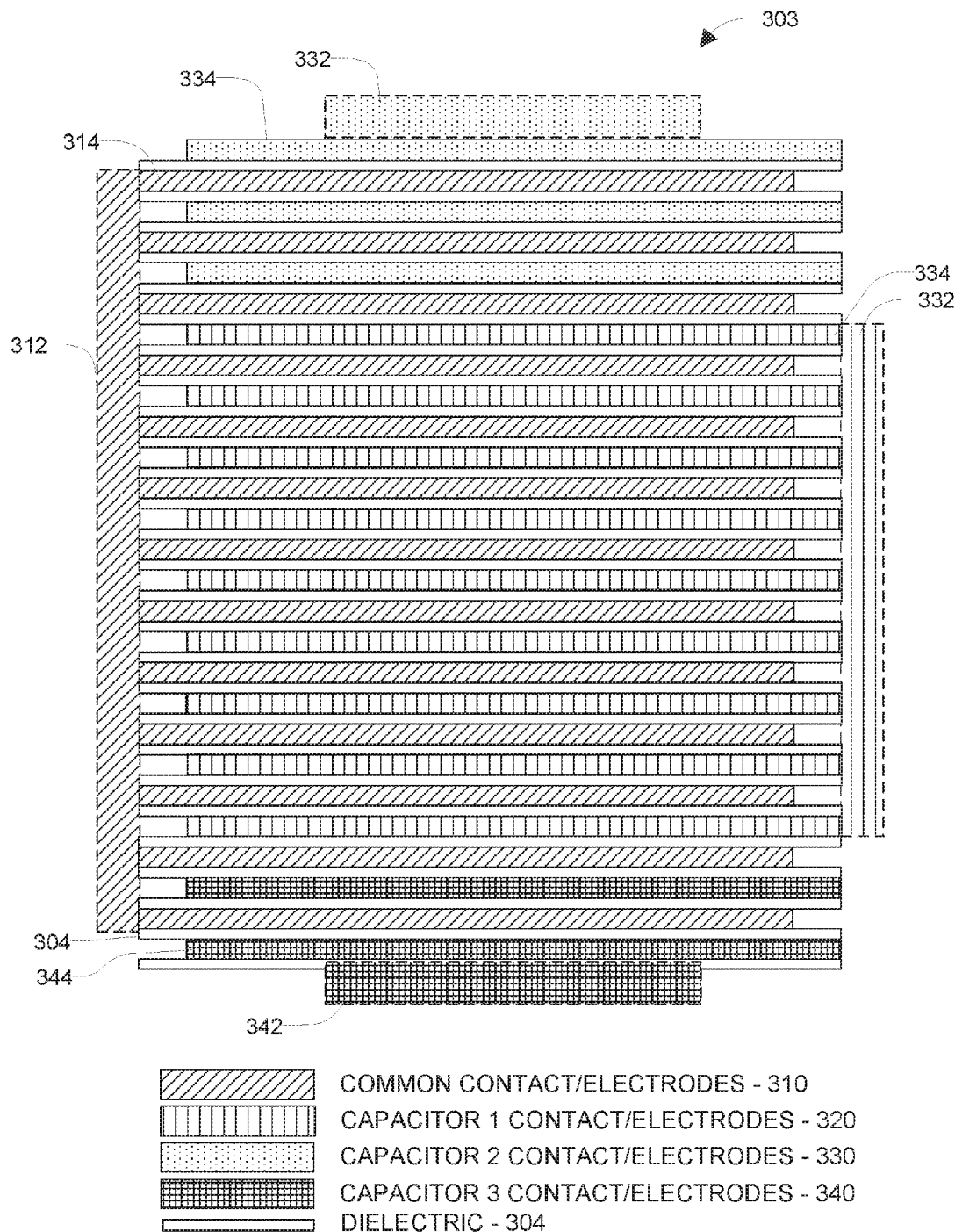

Turning now to FIG. 3D, the device 303 may include attachment of a first contact 312, a second contact 322, a third contact 332, and a fourth contact 342 to the reference electrode 314, the first capacitor electrode 324, the second capacitor electrode 334, and the third capacitor electrode 344, respectively. While FIG. 3D depicts the third contact 332 only being coupled to one of the second capacitor electrode 334, the third contact 332 is coupled to each of the second capacitor electrode 334. Further, while FIG. 3D depicts the fourth contact 342 only being coupled to one of the third capacitor electrode 344, the fourth contact 342 is coupled to each of the third capacitor electrode 344. The first contact 312, second contact 322, third contact 332, and fourth contact 342 may also include metal materials. In some examples, each of the first contact 312, second contact 322, third contact 332, and fourth contact 342 may include the same material as the material of the reference electrode 314, first capacitor electrode 324, second capacitor electrode 334, and third capacitor electrode 344 to which it is connected. In another example, the first contact 312, second contact 322, third contact 332, and fourth contact 342 may each include a same material, regardless of a material the associated reference electrode 314, first capacitor electrode 324, second capacitor electrode 334, or third capacitor electrode 344. In some examples, the first contact 312, second contact 322, third contact 332, and fourth contact 342 may include silver, copper, nickel, aluminum, etc.

The dielectric layer 304 may be formed by mixing ceramic powder with binder and solvents to create the slurry. The slurry may be poured onto conveyor belt inside a drying oven, resulting in the dry ceramic tape. This may then cut into square pieces called sheets. The thickness of the sheet may determine a voltage rating of an associated capacitor. For each of the reference electrode 314, the first capacitor electrode 324, the second capacitor electrode 334, and the third capacitor electrode 344, an electrode ink is made from a metal powder that is mixed with solvents and ceramic material to make the electrode ink. The reference electrode 314, the first capacitor electrode 324, the second capacitor electrode 334, and the third capacitor electrode 344 may each be printed onto the ceramic sheets (e.g., the dielectric layer 304) using a screen printing process. The ceramic sheets with the printed electrodes may be stacked to form a combined stack of the first capacitor stack 392, the second capacitor stack 394, and the third capacitor stack 396, as depicted and described with reference to the device 302 of FIG. 3C. Once stacked, pressure is applied to the combined stack to fuse all the separate layers and create a monolithic structure (e.g., a bar). The bar may be cut into all the separate devices, such as the device 302. The separate devices may be fired in kilns. The temperature profile may be very important to the characteristics of the capacitors of the separate devices. The first contact 312, the second contact 322, the third contact 332, and the fourth contact 342 may be attached to the device 302 to form the device 303. The device 303 may be included in the capacitor device 200 of FIGS. 2A and 2B.

Figure 4:
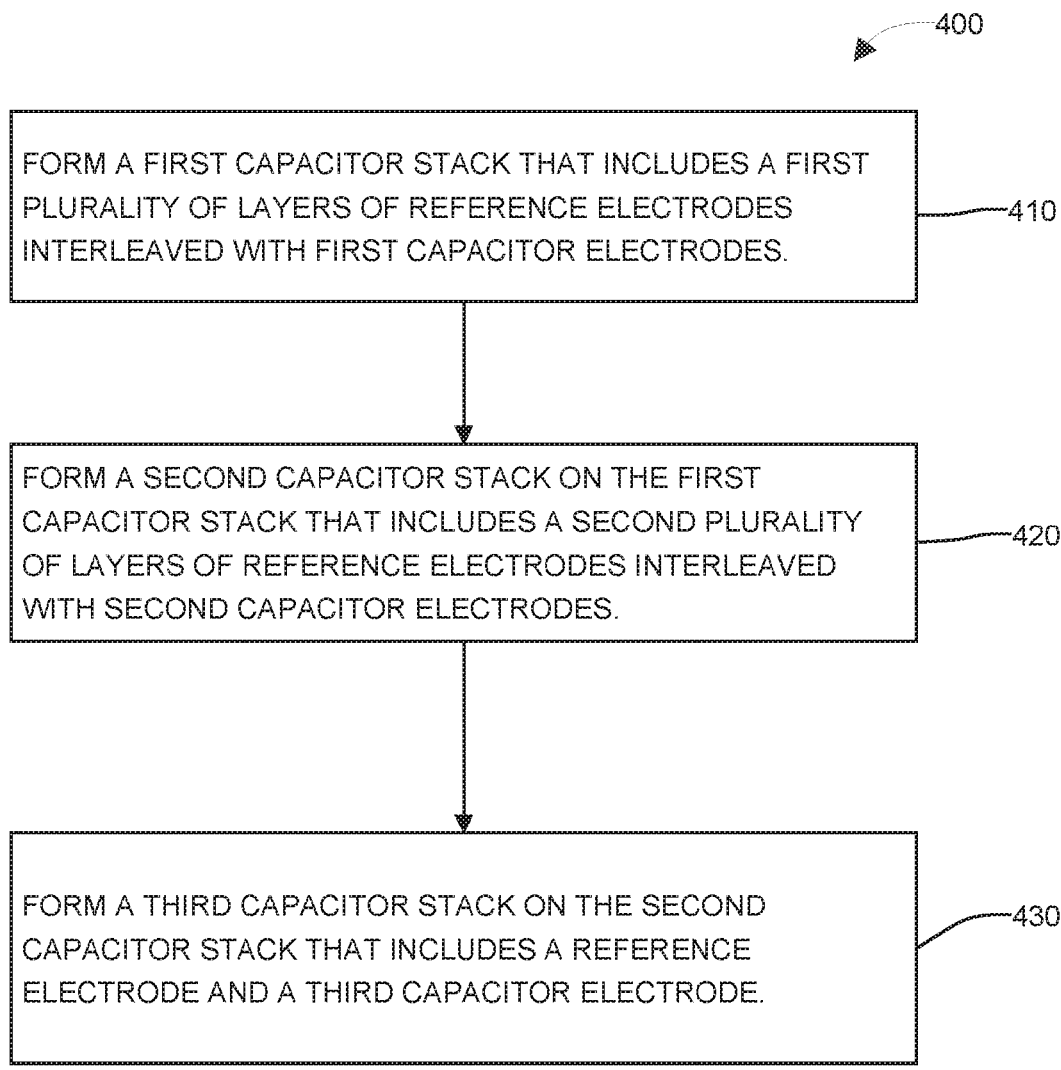
FIG. 4 illustrates a method for forming a three capacitor stack in accordance with some embodiments.

FIG. 4 illustrates a method 400 for forming a three capacitor stack in accordance with some embodiments. The method 400 may be implemented the capacitor device 130 of FIG. 1, the capacitor device 200 of FIGS. 2A and 2B, the devices 300-303 of FIGS. 3A-DD, or combinations thereof.

The method 400 may include forming a first capacitor stack that includes a first plurality of layers of reference electrodes interleaved with first capacitor electrodes, at 410. The method 400 may include forming a second capacitor stack on the first capacitor stack that includes a second plurality of layers of reference electrodes interleaved with second capacitor electrodes, at 420. The method 400 may include forming a third capacitor stack on the second capacitor stack that includes a third plurality of layers of reference electrodes interleaved with third capacitor electrodes, at 430. A respective layer of dielectric material may be formed between each the reference electrodes and the first electrodes of the first capacitor stack, the second electrodes of the second capacitor stack, and the third electrodes of the third capacitor stack. The first capacitor stack may include the first capacitor stack 392 of FIGS. 3A-3C, the second capacitor stack may include the second capacitor stack 394 of FIGS. 3B and 3C, and the third capacitor stack may include the first capacitor stack 392 of FIG. 3C. The reference electrodes may include the electrodes 214 of FIGS. 2A and 2B, the reference electrode 314 of FIGS. 3A-3D, or combinations thereof. The first capacitor electrodes may include the first capacitor electrodes 224 of FIGS. 2A and 2B, the first capacitor electrode 324 of FIGS. 3A-3D, or combinations thereof. The second capacitor electrodes may include the second capacitor electrodes 234 of FIGS. 2A and 2B, the second capacitor electrode 334 of FIGS. 3B-3D, or combinations thereof. The third capacitor electrodes may include the third capacitor electrodes 244 of FIGS. 2A and 2B, the third capacitor electrode 344 of FIGS. 3C and 3D, or combinations thereof. The layers of dielectric material may include the dielectric layer dielectric layer 204 of FIGS. 2A and 2B, the dielectric layer 304 of FIGS. 3A-3D, or combinations thereof.

In some examples, a count of the first plurality of layers is different than a count of the second plurality of layers. In some examples, a count of the second plurality of layers of the second electrode stack is two orders of magnitude greater than a count of the third plurality of layers of the third capacitor stack, and the count of the second plurality of layers of the second electrode stack is two orders of magnitude greater than a count of the first plurality of layers of the first capacitor stack. The method 400 may further include forming a first contact connected to the first capacitor electrodes of the first electrode stack, forming a second contact connected to the second capacitor electrodes of the second electrode stack, forming a third contact connected to the third electrodes of the third electrode stack, and forming a fourth contact connected to the reference electrodes of the first electrode stack, the second electrode stack, and the third electrode stack. The first, second, third, and fourth contacts may include the first contact 224, the second contact 234, the third contact 244, and the reference contact 244, respectively, of FIGS. 2A and 2B; the first capacitor electrode 324, the second capacitor electrode 334, the third capacitor electrode 344, and the reference contact reference electrode 314, respectively, of FIGS. 3A-3D, or combinations thereof. Forming the first or second layer of the dielectric material may include rolling a slurry of ceramic material into a sheet. In some examples, the layer of the dielectric material may be less than 0.5 μm.

Forming a capacitor stack (e.g., the first, second, or third capacitor stack) may include forming a first stackable unit, forming a second stackable unit, and layering the first stackable unit over the second stackable unit. Forming the first stackable unit may include forming a first layer of the dielectric material and forming a conductive material over the first layer of dielectric material. Forming the second stackable unit may include forming a second layer of dielectric material, and forming a conductive material over the layer of dielectric material. The stackable units may include the reference electrode stackable unit 382 or the first capacitor electrode stackable unit 384 of FIG. 3A, the second capacitor electrode stackable unit 386 of FIG. 3B, the third capacitor electrode stackable unit 388 of FIG. 3C, or combinations thereof.

Forming the electrodes (e.g., the first, second, or third capacitor electrodes, or the reference electrodes) may include printing a material on a layer of the dielectric material. The material may be the same for the first, second, and third capacitor electrodes, and the reference electrodes, in some examples. In other examples, the material may be different for at least two of the first, second, or third capacitor electrodes, or the reference electrodes. In some examples, the first, second, and third capacitor electrodes, and the reference electrodes may include one of a silver alloy, a palladium alloy, a nickel alloy or a copper alloy.

The method 400 may further include after forming the third capacitor stack, firing the first capacitor stack, the second capacitor stack, and the third capacitor stack in a kiln. The method 400 may further include forming a single device having three capacitors using the first electrode stack, the second electrode stack, and the third electrode stack. The single device may include the capacitor device 200 of FIGS. 2A and 2B, the device 303 of FIG. 3D, or combinations thereof.

Figure 5:
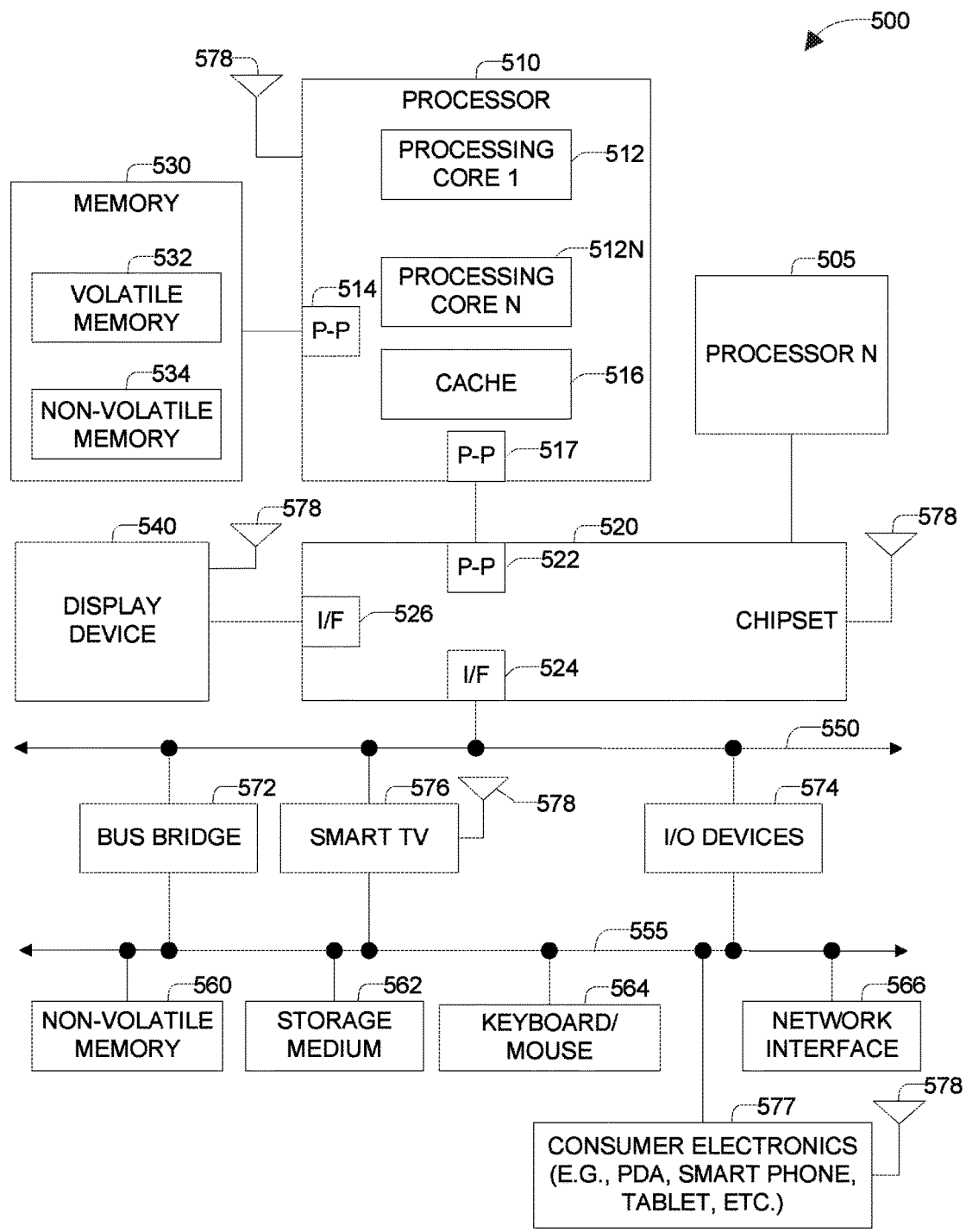
FIG. 5 illustrates a system level diagram, according to one embodiment of the disclosure.

FIG. 5 illustrates a system level diagram, according to one embodiment of the invention. For instance, FIG. 5 depicts an example of an electronic device (e.g., system) including a capacitor device as described in the present disclosure, such as the capacitor device 130 of FIG. 1, the capacitor device 200 of FIG. 2. The capacitor device 303 of FIG. 3D, or combinations thereof. FIG. 5 is included to show an example of a higher level device application for the present invention. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 is a system on a chip (SOC) system.

In one embodiment, processor 510 has one or more processing cores 512 and 512N, where 512N represents the Nth processor core inside processor 510 where N is a positive integer. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to a wireless antenna 578 to communicate with any device configured to transmit and/or receive wireless signals. In one embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the invention, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510, 505N, display device 540, and other devices 572, 576, 574, 560, 562, 564, 566, 577, etc. Chipset 520 may also be coupled to a wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the invention, processor 510 and chipset 520 are merged into a single SOC. In addition, chipset 520 connects to one or more buses 550 and 555 that interconnect various elements 574, 560, 562, 564, and 566. Buses 550 and 555 may be interconnected together via a bus bridge 572. In one embodiment, chipset 520 couples with a non-volatile memory 560, a mass storage device(s) 562, a keyboard/mouse 564, and a network interface 566 via interface 524 and/or 504, smart TV 576, consumer electronics 577, etc.

In one embodiment, mass storage device 562 includes, but is not limited to, a solid state drive, a hard disk drive, a universal serial bus flash memory drive, or any other form of computer data storage medium. In one embodiment, network interface 566 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into processor core 512.

To better illustrate the methods and device disclosed herein, a non-limiting list of embodiments is provided here:

Example 1 is an apparatus, comprising: a capacitor device comprising: a first capacitor stack, the first capacitor stack including a first plurality of layers of reference electrodes interleaved with first capacitor electrodes, wherein, a respective layer of dielectric material is included in between each of the reference electrodes and the first capacitor electrodes; and a second capacitor stack, the second capacitor stack including a reference electrode layered over a second capacitor electrode, wherein, a respective layer of dielectric material is included in between the reference electrode and the second capacitor electrode.

In Example 2, the subject matter of Example 1 optionally includes a third capacitor stack, the third capacitor stack including a third plurality of layers of reference electrodes interleaved with third capacitor electrodes, wherein, a respective dielectric layer is included in between each of the reference electrodes and the third capacitor electrodes.

In Example 3, the subject matter of Example 2 optionally includes wherein a count of the first plurality of layers is different than a count of the third plurality of layers.

In Example 4, the subject matter of any one or more of Examples 1-3 optionally include a first contact connected to the first capacitor electrodes of the first capacitor stack; a second contact connected to the second capacitor electrode of the second capacitor stack; and a third contact connected to the reference electrodes of the first capacitor stack and the second capacitor stack.

In Example 5, the subject matter of Example 4 optionally includes wherein a first capacitor electrode of the first capacitor electrodes of the first capacitor stack is offset from a first edge of a contacting layer of the dielectric material to provide a gap between the first capacitor electrode and the second contact, and wherein a particular reference electrode of the reference electrodes of the first capacitor is offset from a second edge of the contacting layer of the dielectric material to provide a gap between the particular reference electrode and the first contact.

In Example 6, the subject matter of any one or more of Examples 1-5 optionally include wherein the first capacitor electrodes of the first capacitor stack include a first material, wherein the second capacitor electrode of the second capacitor stack includes a second material; and wherein the reference electrodes of the first capacitor and the second capacitor include a third material.

In Example 7, the subject matter of Example 6 optionally includes wherein the first material is different than the second material.

In Example 8, the subject matter of any one or more of Examples 6-7 optionally include wherein the first material, the second material, and the third material include a same material.

In Example 9, the subject matter of any one or more of Examples 6-8 optionally include wherein the first material and the third material each include one of a silver alloy, a palladium alloy, a nickel alloy or a copper alloy.

In Example 10, the subject matter of any one or more of Examples 1-9 optionally include wherein the dielectric material includes a ceramic material.

In Example 11, the subject matter of any one or more of Examples 1-10 optionally include wherein the device is a multi-layer ceramic chip capacitor.

In Example 12, the subject matter of any one or more of Examples 1-11 optionally include wherein the layer of the dielectric material of the first capacitor electrode is less than 0.5 µm.

In Example 13, the subject matter of any one or more of Examples 1-12 optionally include a voltage regulator that includes the capacitor device.

In Example 14, the subject matter of any one or more of Examples 1-13 optionally include wherein the first capacitor stack has a capacitance value of 47 µF, and wherein the second capacitor stack has a capacitance value of 4.7 µF.

In Example 15, the subject matter of any one or more of Examples 1-14 optionally include wherein a count of the first plurality of layers of the first capacitor stack is an order of magnitude greater than a count of layers of the second capacitor stack.

In Example 16, the subject matter of any one or more of Examples 1-15 optionally include a chipset, wherein the chipset includes the capacitor device.

Example 17 is a capacitor device, the capacitor device comprising: a first capacitor stack that includes a first plurality of layers of reference electrodes interleaved with first capacitor electrodes; a second capacitor stack on the first capacitor stack that includes a second plurality of layers of reference electrodes interleaved with second capacitor electrodes; and a third capacitor stack on the second capacitor stack that includes a reference electrode and a third capacitor electrode, wherein a respective layer of dielectric material is formed between the reference electrodes and the first capacitor electrodes, the second capacitor electrodes, and the third capacitor electrode.

In Example 18, the subject matter of Example 17 optionally includes wherein a count of the first plurality of layers is different than a count of the second plurality of layers.

In Example 19, the subject matter of any one or more of Examples 17-18 optionally include a first contact connected to the first capacitor electrodes of the first capacitor stack; a second contact connected to the second capacitor electrode of the second capacitor stack; a third contact connected to the third capacitor electrode; and a fourth contact connected to the reference electrodes of the first capacitor stack and the second capacitor stack.

In Example 20, the subject matter of Example 19 optionally includes wherein a first capacitor electrode of the first capacitor electrodes of the first capacitor stack is offset from a first edge of a contacting layer of the dielectric material to provide a gap between the first capacitor electrode and the second contact, and wherein a particular reference electrode of the reference electrodes of the first capacitor is offset from a second edge of the contacting layer of the dielectric material to provide a gap between the particular reference electrode and the first contact.

In Example 21, the subject matter of any one or more of Examples 17-20 optionally include wherein the first capacitor electrodes of the first capacitor stack include a first material, wherein the second capacitor electrode of the second capacitor stack includes a second material; and wherein the reference electrodes of the first capacitor and the second capacitor include a third material.

In Example 22, the subject matter of Example 21 optionally includes wherein the first material is different than at least one of the second material or the third material.

In Example 23, the subject matter of any one or more of Examples 21-22 optionally include wherein the first material, the second material, and the third material include a same material.

In Example 24, the subject matter of any one or more of Examples 21-23 optionally include wherein the first material, the second material, and the third material each include at least one of a silver alloy, a palladium alloy, a nickel alloy or a copper alloy.

In Example 25, the subject matter of any one or more of Examples 17-24 optionally include wherein the dielectric material includes a ceramic material.

In Example 26, the subject matter of any one or more of Examples 17-25 optionally include wherein the capacitor device is a multi-layer ceramic chip capacitor.

In Example 27, the subject matter of any one or more of Examples 17-26 optionally include wherein the layer of the dielectric material of the first capacitor electrode is less than 0.5 µm.

In Example 28, the subject matter of any one or more of Examples 17-27 optionally include wherein the first capacitor stack has a capacitance value of 47 µF or 22 µF, wherein the second capacitor stack has a capacitance value of 4.7 µF or 2.2 µF, wherein the third capacitor stack has a capacitance value of 0.47 µF or 0.22 µF.

In Example 29, the subject matter of any one or more of Examples 17-28 optionally include wherein a count of the first plurality of layers of the first capacitor electrode is an order of magnitude greater than a count of the second plurality of layers of the second capacitor.

Example 30 is a method, comprising: forming a first capacitor stack that includes a first plurality of layers of reference electrodes interleaved with first capacitor electrodes; forming a second capacitor stack on the first capacitor stack that includes a second plurality of layers of reference electrodes interleaved with second capacitor electrodes; and forming a third capacitor stack on the second capacitor stack that includes a reference electrode and a third capacitor electrode, wherein a respective layer of dielectric material is formed between the reference electrodes and the first capacitor electrodes, the second capacitor electrodes, and the third capacitor electrode.

In Example 31, the subject matter of Example 30 optionally includes after forming the third capacitor stack, firing the first capacitor stack, the second capacitor stack, and the third capacitor stack in a kiln.

In Example 32, the subject matter of any one or more of Examples 30-31 optionally include wherein a count of the first plurality of layers is different than a count of the second plurality of layers.

In Example 33, the subject matter of any one or more of Examples 30-32 optionally include forming a first contact connected to the first capacitor electrodes of the first capacitor stack; forming a second contact connected to the second capacitor electrodes of the second capacitor stack; and forming a third contact connected to the third capacitor electrode of the third capacitor stack; and forming a fourth contact connected to the reference electrodes of the first capacitor stack, the second capacitor stack, and the third capacitor stack.

In Example 34, the subject matter of Example 33 optionally includes wherein forming the first capacitor stack includes: forming a first stackable unit by: forming a layer of dielectric material; and forming a conductive material over the layer of dielectric material; forming a second stackable unit by: forming a layer of dielectric material; and forming a conductive material over the layer of dielectric material.

In Example 35, the subject matter of any one or more of Examples 30-34 optionally include forming the first capacitor electrodes of the first capacitor stack by printing a first material on a first layer of the dielectric material; forming the second capacitor electrodes of the second capacitor stack by printing a second material on a second layer of the dielectric material; forming the third capacitor electrode of the third capacitor stack by printing a third material on a third layer of the dielectric material; and forming the reference electrodes of the first capacitor stack, the second capacitor stack, and the third capacitor stack by printing a fourth material on a fourth layer of the dielectric material.

In Example 36, the subject matter of Example 35 optionally includes forming the layer of the dielectric material includes rolling a slurry of ceramic material into a sheet.

In Example 37, the subject matter of Example 36 optionally includes wherein the first material is different than the second material.

In Example 38, the subject matter of any one or more of Examples 36-37 optionally include wherein the first material, the second material, and the third material include a same material.

In Example 39, the subject matter of any one or more of Examples 36-38 optionally include wherein the first material, the second material, and the third material each include one of a silver alloy, a palladium alloy, a nickel alloy or a copper alloy.

In Example 40, the subject matter of any one or more of Examples 30-39 optionally include wherein forming a single device having three capacitors using the first capacitor stack, the second capacitor stack, and the third capacitor stack.

In Example 41, the subject matter of any one or more of Examples 30-40 optionally include wherein the layer of the dielectric material of the first capacitor electrode is less than 0.5 μm.

In Example 42, the subject matter of any one or more of Examples 30-41 optionally include wherein a count of the second plurality of layers of the second capacitor stack is two orders of magnitude greater than a count of layers of the third capacitor stack, and wherein the count of the second plurality of layers of the second capacitor stack is two orders of magnitude greater than a count of the first plurality of layers of the first capacitor stack.

Example 43 is a apparatus, comprising: means for forming a first capacitor stack that includes a first plurality of layers of reference electrodes interleaved with first capacitor electrodes; means for forming a second capacitor stack on the first capacitor stack that includes a second plurality of layers of reference electrodes interleaved with second capacitor electrodes; and means for forming a third capacitor stack on the second capacitor stack that includes a reference electrode and a third capacitor electrode, wherein a respective layer of dielectric material is formed between the reference electrodes and the first capacitor electrodes, the second capacitor electrodes, and the third capacitor electrode.

In Example 44, the subject matter of Example 43 optionally includes after the third capacitor stack has been formed, means for firing the first capacitor stack, the second capacitor stack, and the third capacitor stack in a kiln.

In Example 45, the subject matter of any one or more of Examples 43-44 optionally include wherein a count of the first plurality of layers is different than a count of the second plurality of layers.

In Example 46, the subject matter of any one or more of Examples 43-45 optionally include means for forming a first contact connected to the first capacitor electrodes of the first capacitor stack; means for forming a second contact connected to the second capacitor electrodes of the second capacitor stack; and means for forming a third contact connected to the third capacitor electrode of the third capacitor stack; and means for forming a fourth contact connected to the reference electrodes of the first capacitor stack, the second capacitor stack, and the third capacitor stack.

In Example 47, the subject matter of Example 46 optionally includes wherein means for forming the first capacitor stack includes: means for forming a first stackable unit including: means for forming a layer of dielectric material; and means for forming a conductive material over the layer of dielectric material; means for forming a second stackable unit including: means for forming a layer of dielectric material; and means for forming a conductive material over the layer of dielectric material.

In Example 48, the subject matter of any one or more of Examples 43-47 optionally include means for forming the first capacitor electrodes of the first capacitor stack by printing a first material on a first layer of the dielectric material; means for forming the second capacitor electrodes of the second capacitor stack by printing a second material on a second layer of the dielectric material; means for forming the third capacitor electrode of the third capacitor stack by printing a third material on a third layer of the dielectric material; and means for forming the reference electrodes of the first capacitor stack, the second capacitor stack, and the third capacitor stack by printing a fourth material on a fourth layer of the dielectric material.

In Example 49, the subject matter of Example 48 optionally includes means for forming the layer of the dielectric material includes rolling a slurry of ceramic material into a sheet.

In Example 50, the subject matter of Example 49 optionally includes wherein the first material is different than the second material.

In Example 51, the subject matter of any one or more of Examples 49-50 optionally include wherein the first material, the second material, and the third material include a same material.

In Example 52, the subject matter of any one or more of Examples 49-51 optionally include wherein the first material, the second material, and the third material each include one of a silver alloy, a palladium alloy, a nickel alloy or a copper alloy.

In Example 53, the subject matter of any one or more of Examples 43-52 optionally include wherein means for forming a single device having three capacitors using the first capacitor stack, the second capacitor stack, and the third capacitor stack.

In Example 54, the subject matter of any one or more of Examples 43-53 optionally include wherein the layer of the dielectric material of the first capacitor electrode is less than 0.5 μm.

In Example 55, the subject matter of any one or more of Examples 43-54 optionally include wherein a count of the second plurality of layers of the second capacitor stack is two orders of magnitude greater than a count of layers of the third capacitor stack, and wherein the count of the second plurality of layers of the second capacitor stack is two orders of magnitude greater than a count of the first plurality of layers of the first capacitor stack.

These examples are intended to provide non-limiting examples of the present subject matter—they are not intended to provide an exclusive or exhaustive explanation. The detailed description above is included to provide further information about the present devices, and methods.

The above detailed description includes references to the accompanying drawings, which form a part of the detailed description. The drawings show, by way of illustration, specific embodiments in which the disclosure can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the disclosure should be determined with reference to the appended claims, along with the full scope of equivalents to which such claims are entitled.

What is claimed is:

1. An apparatus, comprising:
  a capacitor device comprising:
  a first capacitor stack, the first capacitor stack including a first plurality of layers of reference electrodes interleaved with first capacitor electrodes, wherein, a respective layer of dielectric material is included in between each of the reference electrodes and the first capacitor electrodes; and
  a second capacitor stack, the second capacitor stack including a reference electrode layered over a second capacitor electrode, wherein, a respective layer of dielectric material is included in between the reference electrode and the second capacitor electrode.

2. The apparatus of claim 1, further comprising a third capacitor stack, the third capacitor stack including a third plurality of layers of reference electrodes interleaved with third capacitor electrodes, wherein, a respective dielectric layer is included in between each of the reference electrodes and the third capacitor electrodes.

3. The apparatus of claim 2, wherein a count of the first plurality of layers is different than a count of the third plurality of layers.

4. The apparatus of claim 1, further comprising:
  a first contact connected to the first capacitor electrodes of the first capacitor stack;
  a second contact connected to the second capacitor electrode of the second capacitor stack; and
  a third contact connected to the reference electrodes of the first capacitor stack and the second capacitor stack.

5. The apparatus of claim 4, wherein a first capacitor electrode of the first capacitor electrodes of the first capacitor stack is offset from a first edge of a contacting layer of the dielectric material to provide a gap between the first capacitor electrode and the second contact, and wherein a particular reference electrode of the reference electrodes of the first capacitor is offset from a second edge of the contacting layer of the dielectric material to provide a gap between the particular reference electrode and the first contact.

6. The apparatus of claim 1, wherein the first capacitor electrodes of the first capacitor stack include a first material, wherein the second capacitor electrode of the second capacitor stack includes a second material; and wherein the reference electrodes of the first capacitor and the second capacitor include a third material.

7. The apparatus of claim 6, wherein the first material is different than the second material.

8. The apparatus of claim 6, wherein the first material, the second material, and the third material include a same material.

9. The apparatus of claim 6, wherein the first material and the third material each include one of a silver alloy, a palladium alloy, a nickel alloy or a copper alloy.

10. The apparatus of claim 1, wherein the dielectric material includes a ceramic material.

11. The apparatus of claim 1, wherein the device is a multi-layer ceramic chip capacitor.

12. The apparatus of claim 1, further comprising a chipset, wherein the chipset includes the capacitor device.

13. A capacitor device, the capacitor device comprising:
  a first capacitor stack that includes a first plurality of layers of reference electrodes interleaved with first capacitor electrodes;
  a second capacitor stack on the first capacitor stack that includes a second plurality of layers of reference electrodes interleaved with second capacitor electrodes; and
  a third capacitor stack on the second capacitor stack that includes a reference electrode and a third capacitor electrode, wherein a respective layer of dielectric material is formed between the reference electrodes and the first capacitor electrodes, the second capacitor electrodes, and the third capacitor electrode.

14. The capacitor device of claim 13, wherein a count of the first plurality of layers is different than a count of the second plurality of layers.

15. The capacitor device of claim 13, further comprising:
  a first contact connected to the first capacitor electrodes of the first capacitor stack;
  a second contact connected to the second capacitor electrode of the second capacitor stack;
  a third contact connected to the third capacitor electrode; and
  a fourth contact connected to the reference electrodes of the first capacitor stack and the second capacitor stack.

16. The capacitor device of claim 13, wherein the dielectric material includes a ceramic material.

17. The capacitor device of claim 13, wherein the first capacitor stack has a capacitance value of 47 µF or 22 µF, wherein the second capacitor stack has a capacitance value of 4.7 µF or 2.2 µF, wherein the third capacitor stack has a capacitance value of 0.47 µF or 0.22 µF.

18. The capacitor device of claim 13, wherein a count of the first plurality of layers of the first capacitor electrode is an order of magnitude greater than a count of the second plurality of layers of the second capacitor.

19. A method, comprising:
forming a first capacitor stack that includes a first plurality of layers of reference electrodes interleaved with first capacitor electrodes;
forming a second capacitor stack on the first capacitor stack that includes a second plurality of layers of reference electrodes interleaved with second capacitor electrodes; and
forming a third capacitor stack on the second capacitor stack that includes a reference electrode and a third capacitor electrode, wherein a respective layer of dielectric material is formed between the reference electrodes and the first capacitor electrodes, the second capacitor electrodes, and the third capacitor electrode.

20. The method of claim 19, further comprising, after forming the third capacitor stack, firing the first capacitor stack, the second capacitor stack, and the third capacitor stack in a kiln.

21. The method of claim 19, wherein a count of the first plurality of layers is different than a count of the second plurality of layers.

22. The method of claim 19, further comprising:
forming a first contact connected to the first capacitor electrodes of the first capacitor stack;
forming a second contact connected to the second capacitor electrodes of the second capacitor stack; and
forming a third contact connected to the third capacitor electrode of the third capacitor stack; and
forming a fourth contact connected to the reference electrodes of the first capacitor stack, the second capacitor stack, and the third capacitor stack.

23. The method of claim 22, wherein forming the first capacitor stack includes:
forming a first stackable unit by:
forming a layer of dielectric material; and
forming a conductive material over the layer of dielectric material;
forming a second stackable unit by:
forming a layer of dielectric material; and
forming a conductive material over the layer of dielectric material.

24. The method of claim 19, further comprising:
forming the first capacitor electrodes of the first capacitor stack by printing a first material on a first layer of the dielectric material;
forming the second capacitor electrodes of the second capacitor stack by printing a second material on a second layer of the dielectric material;
forming the third capacitor electrode of the third capacitor stack by printing a third material on a third layer of the dielectric material; and
forming the reference electrodes of the first capacitor stack, the second capacitor stack, and the third capacitor stack by printing a fourth material on a fourth layer of the dielectric material.

25. The method of claim 19, wherein a count of the second plurality of layers of the second capacitor stack is two orders of magnitude greater than a count of layers of the third capacitor stack, and wherein the count of the second plurality of layers of the second capacitor stack is two orders of magnitude greater than a count of the first plurality of layers of the first capacitor stack.

* * * * *